US011041879B2

(12) United States Patent
Atwood et al.

(10) Patent No.: US 11,041,879 B2
(45) Date of Patent: Jun. 22, 2021

(54) FLUIDIZED ALIGNMENT OF A SEMICONDUCTOR DIE TO A TEST PROBE

(71) Applicant: International Business Machines Corporation, Armonk, NY (US)

(72) Inventors: Eugene Atwood, Housatonic, MA (US); David Audette, Colchester, VT (US); Grant Wagner, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 196 days.

(21) Appl. No.: 16/434,147

(22) Filed: Jun. 6, 2019

(65) Prior Publication Data

US 2020/0386785 A1    Dec. 10, 2020

(51) Int. Cl.
*G01R 31/00*     (2006.01)
*G01R 1/04*      (2006.01)
*G01R 31/28*     (2006.01)
*G01R 1/073*     (2006.01)

(52) U.S. Cl.
CPC ....... *G01R 1/0408* (2013.01); *G01R 31/2831* (2013.01); *G01R 31/2851* (2013.01); *G01R 31/2886* (2013.01); *G01R 31/2887* (2013.01); *G01R 31/2891* (2013.01); *G01R 31/2893* (2013.01); *G01R 1/07314* (2013.01); *G01R 31/2867* (2013.01)

(58) Field of Classification Search
CPC ............ G01R 31/2887; G01R 31/2893; G01R 1/0408; G01R 31/2891; G01R 31/2886; G01R 31/2851; G01R 31/2867; G01R 1/07314; G01R 31/2831

USPC ......... 324/71, 378, 403, 415, 425, 500, 537, 324/750.16, 750.19, 750
See application file for complete search history.

(56) References Cited

U.S. PATENT DOCUMENTS

| | | | |
|---|---|---|---|
| 6,539,642 | B1 | 4/2003 | Moriyasu et al. |
| 6,589,855 | B2 | 7/2003 | Miyamoto et al. |
| 7,108,812 | B2 | 9/2006 | Hosoe |
| 7,218,128 | B2 | 5/2007 | Atwood |
| 7,436,195 | B2 | 10/2008 | Ruckenbauer |

(Continued)

FOREIGN PATENT DOCUMENTS

CN        108091583        5/2018

OTHER PUBLICATIONS

Armstrong, "Known-Good-Die Testing of Complex Digital ICs," GO Semi & Beyond, Feb. 2017. pp. 1-4.

*Primary Examiner* — Raul J Rios Russo
(74) *Attorney, Agent, or Firm* — Erik Johnson; Otterstedt, Wallace & Kammer, LLP

(57) ABSTRACT

A semiconductor die is aligned to a test probe by placing the semiconductor die onto a flat upper surface of a test stage with solder balls of the die facing upward, fluidizing motion of the die with reference to the test stage by pulsing gas between the die and the upper surface of the test stage, and coarse aligning the die with reference to the test stage by moving the die until adjacent edges of the die contact corner guides that are disposed on the test stage. Further, the method includes raising the test stage toward the test probe until an alignment feature of the test probe engages a first solder ball of the die, and fine aligning the die with reference to the test probe by continuing to raise the test stage until a second solder ball of the die fits into a test cup of the test probe.

20 Claims, 14 Drawing Sheets

(56) References Cited

U.S. PATENT DOCUMENTS

| | | | |
|---|---|---|---|
| 2008/0122432 A1* | 5/2008 | Mueller | G01R 31/2891 324/750.25 |
| 2010/0243071 A1* | 9/2010 | Di Stefano | G01R 31/2891 137/15.01 |
| 2012/0299609 A1* | 11/2012 | Rutigliano | G01R 31/2891 324/750.03 |
| 2016/0178663 A1 | 6/2016 | Prabhugoud et al. | |
| 2018/0017592 A1 | 1/2018 | Audette et al. | |

* cited by examiner

FLUIDIZED ALIGNMENT OF A SEMICONDUCTOR DIE TO A TEST PROBE

BACKGROUND

The present invention relates to the electrical, electronic, and computer arts, and more specifically, to quality control processes during semiconductor die manufacturing.

During quality control of semiconductor dies, one test procedure involves assessing a die for proper electrical functioning during thermal transients. A thermal stage can be provided for this test procedure. A typical use of the thermal stage is to control the temperature of the die, or in the case of a high-powered die, to prevent the die from overheating during electrical testing. Thermal testing is also meant to prove that the die is operational at allowed temperature extremes. Thermal transient testing is a method to elicit and observe proper die functionality during rapid changes in die temperature.

All of the various tests are typically carried out with the die turned bumps-up and resting top down on a test stage, and with a test probe engaged against the bumps of the die. The test stage provides the thermal control while the test probe provides test current and voltage and measures the electrical responses of the die under test. In order for this test to be carried out, the bumps of the die should be aligned to cups of the test probe that mechanically and electrically engage the bumps. Currently, alignment is achieved using three- or four-axis electromechanical drives to move the test stage along x, y, and z axes (the x and y axes being parallel to a plane of the test stage, the z axis being perpendicular to the plane of the test stage) and optionally around the z axis by an angle theta as well. The electromechanical drives may be automatically controlled by a processor in response to computer vision comparison of the bump positions to the test cup positions, with the camera(s) often being mounted in the body of the test probe.

SUMMARY

Principles of the invention provide techniques for fluidized alignment of a semiconductor die to a test probe. In one aspect, an exemplary method includes placing a semiconductor die onto a flat upper surface of a test stage with solder balls of the die facing upward, fluidizing motion of the die with reference to the test stage by pulsing gas between the die and the upper surface of the test stage, and coarse aligning the die with reference to the test stage by moving the die until adjacent edges of the die contact corner guides that are disposed on the test stage. Further, the method includes raising the test stage toward a test probe until an alignment feature of the test probe engages a first solder ball of the die, and fine aligning the die with reference to the test probe by continuing to raise the test stage until a second solder ball of the die fits into a test cup of the test probe. In one or more embodiments, "pulsing" gas refers to a continuous flow with oscillating pressure.

In another aspect, an exemplary apparatus includes a test probe that has an array of test cups at an underside of the test probe, each test cup having a downward opening, and that has at least one alignment feature that protrudes from the underside of the test probe beyond the openings of the test cups; and a test stage that has an upper surface confronting the underside of the test probe and that is movable by a Z drive motor along a Z-axis toward and away from the test probe.

In another aspect, an exemplary apparatus includes a test probe that has an array of test cups at an underside of the test probe, each test cup having a downward opening, and at least one alignment feature that protrudes from the underside of the test probe beyond the openings of the test cups and that has an opening larger than the openings of the test cups. The apparatus also includes a test stage that has an upper surface confronting the underside of the test probe and that is movable by a Z drive motor along a Z-axis toward and away from the test probe. The test stage includes an array of vertical supply holes opening through the upper surface and fluidly connected to a vacuum source and to a compressed gas source and includes a plurality of corner guides that protrude upward from the upper surface. (In one or more embodiments, "vertical" supply holes may be slanted off axes perpendicular to the upper surface of the test stage.) The apparatus also includes a modulator and a proportional valve that are fluidly connected in series between the compressed gas source and the vertical supply holes. The apparatus further includes a coarse align stage that is offset from the test probe and the test stage along a direction parallel to the confronting surfaces of the test probe and the test stage. The apparatus still further includes a pick and place tool that has an arm, a head, and a tool motor that can move the head from a position above the coarse align stage to a position between the test probe and the test stage by moving the arm around a Z axis and moving the head up and down parallel to the Z axis. Additionally, the apparatus includes a controller that is electrically connected to the tool motor and to the Z drive motor for directing movement of the pick and place tool and of the test stage, and that is electrically connected to the modulator and to the proportional valve for controlling flows of compressed gas and vacuum to and from the thermal control surface. The controller is configured to operate the tool motor to move a semiconductor die from the coarse align stage onto the upper surface of the test stage with solder balls of the die facing upward. The controller is configured to operate the modulator and the proportional valve to fluidize motion of the die with reference to the test stage by pulsing gas between the die and the upper surface of the test stage, and is configured to operate the tool motor to coarse align the die with reference to the test stage by moving the die until adjacent edges of the die contact the corner guides that are disposed on the test stage. The controller also is configured to operate the Z drive motor in order to raise the test stage toward the test probe until the alignment feature of the test probe engages a solder ball of the die, and to continue operating the Z drive motor in order to fine align the die with reference to the test probe by continuing to raise the test stage until another solder ball of the die fits into one of the test cups of the test probe.

In view of the foregoing, techniques of the present invention can provide substantial beneficial technical effects. For example, one or more embodiments provide one or more of:

Alignment of a semiconductor die to a test probe without use of electromechanical test stage positioning devices and/or computer vision for fine positioning the die in an x-y plane that is parallel to the test probe plane.

Alignment of a semiconductor die to a test probe with small forces acting on the semiconductor die.

Highly predictable and repeatable alignment of semiconductor die bumps to test cups.

Capability to rapidly change the die temperature. Because the die is not 'packaged,' the thermal time constant of the system will be dominated by how rapidly the thermal stage can change temperature. The heat capacity of the die will not play a significant role in changing temperature.

These and other features and advantages of the present invention will become apparent from the following detailed description of illustrative embodiments thereof, which is to be read in connection with the accompanying drawings.

DETAILED DESCRIPTION

Figure 1:
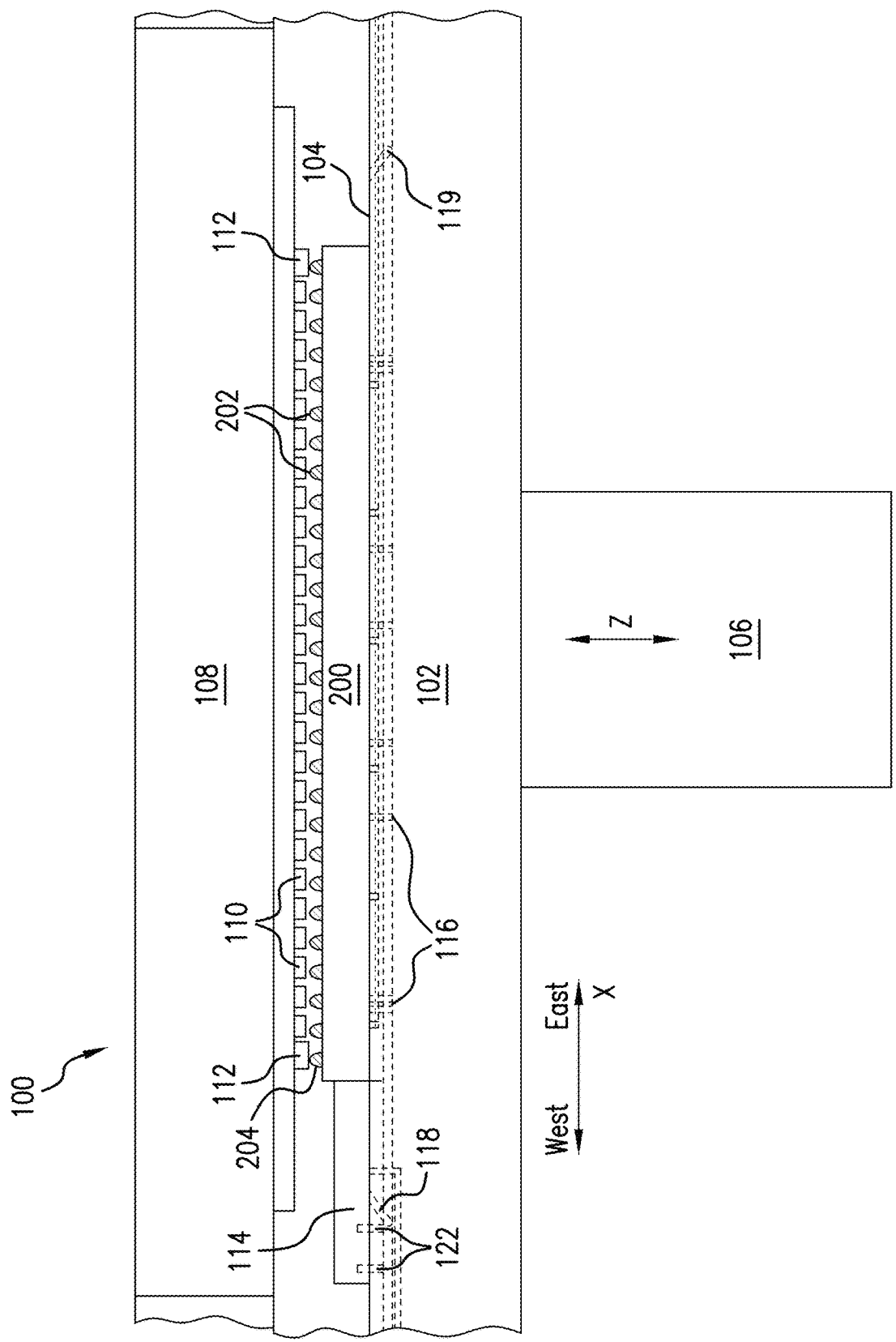
FIG. 1 depicts, in a side schematic view, a semiconductor die positioned on a test stage below a test probe.
Figure 2:
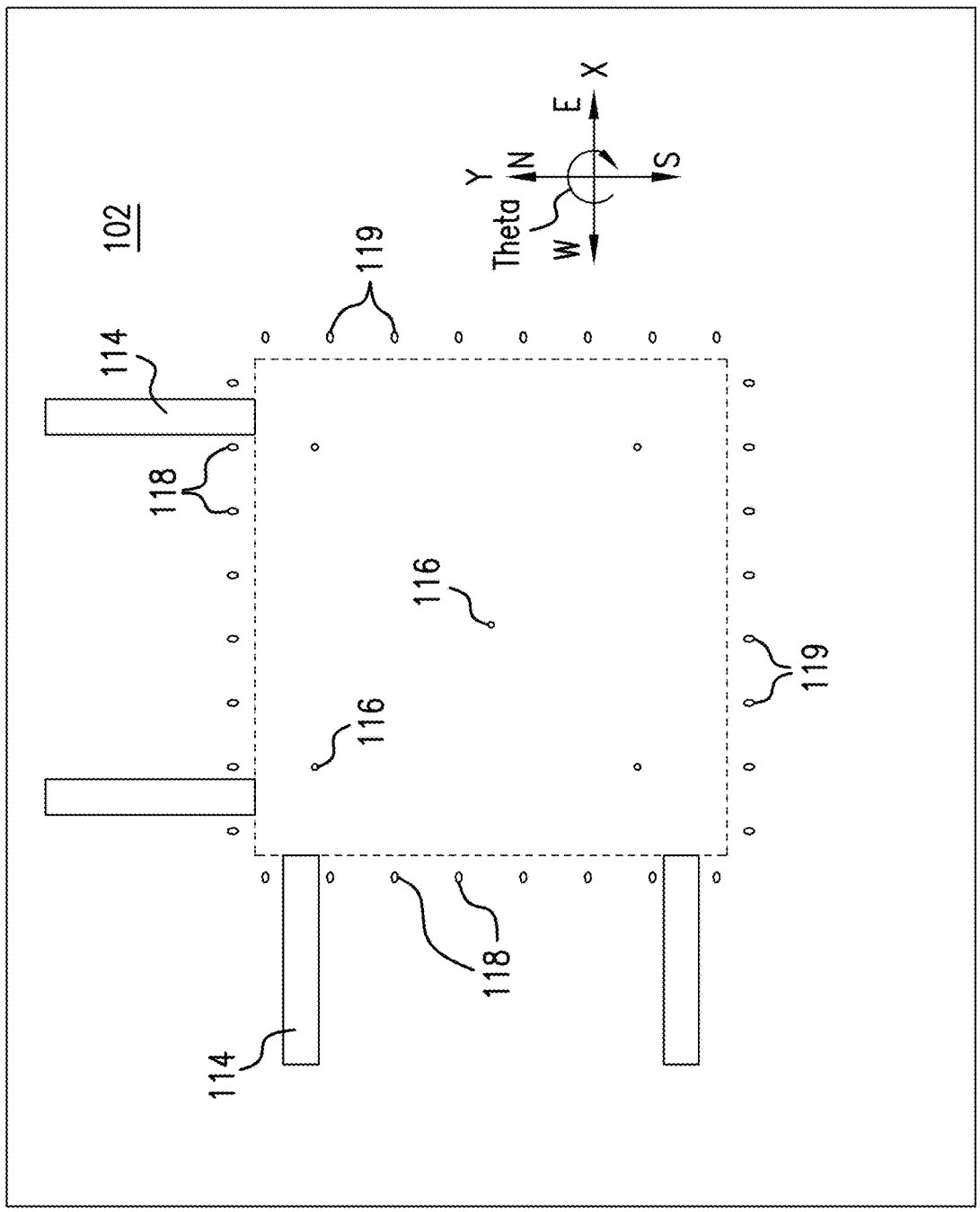
FIG. 2 depicts, in top schematic view, the test stage including corner guides and supply holes for fluidized alignment of the semiconductor die to the test probe.

Generally, bare die alignment methods for fine pitch area array test probes are complicated (and therefore expensive). Current techniques are effective at placing a die accurately in position under a probe using camera-based image methods and high-resolution electromechanical drives for translation stages. The image-based method produces lateral X, Y and Theta offsets (axes X, Y, and Theta are shown in FIG. 2, discussed below) which are applied to the highly repeatable, high resolution mechanisms which locate a die to the test probe. Often the Z axis mechanism (axes X and Z are shown in FIG. 1, discussed below) must be able to apply a large amount of force and be physically robust enough to not introduce X Y slip or tilt error when translating the Z position with and without load. The combination of cameras, image processing, and lateral translation mechanisms have significant cost associated with their use and maintenance.

One or more embodiments advantageously provide solutions for reducing the equipment installation and maintenance costs associated with alignment of a semiconductor die to a test probe, while enhancing repeatability of alignment.

Referring to FIG. 1, a test apparatus 100 includes a test stage 102, which has a thermal control surface 104 and is supported by a Z drive motor 106. The test apparatus 100 also includes a test probe 108, which has an array of test cups 110 and one or more guide cups 112. A semiconductor die 200 is placed in the test apparatus 100, resting on the thermal control surface 104. The semiconductor die 200 is coarse aligned to the test stage 102 and to the test probe 108 by pressing its edges against mechanical stops (guide pins or corner guides) 114, which protrude from the thermal control surface 104. Movement of the semiconductor die 200 across the thermal control surface 104 is lubricated by pulsed compressed fluid (e.g., clean air, nitrogen, helium) that is emitted from vertical supply holes 116, from E, S slanted supply holes 118, and from W, N slanted supply holes 119 (seen in FIG. 2 as well) that are formed through the thermal control surface 104. Once the semiconductor die 200 has been coarse aligned, the test stage 102 is raised toward the test probe 108 to engage the test cups 110 onto bumps 202 of the semiconductor die 200. Pulsed compressed fluid continues to lubricate or fluidize the semiconductor die 200 as the test stage 102 is raised toward the test probe 108. An outer solder ball 204 of the semiconductor die 200 first engages with a guide cup (alignment feature) 112 of the test probe 108, beginning fine alignment of the solder bumps 202 to the test cups 110. As the test stage 102 continues moving toward the test probe 108, the fluidized semiconductor die 200 floats on the lubricating gas so that the bumps 202 can self-align into the test cups 110.

Once satisfactory electrical contact has been made between the test probe 108 and the semiconductor die 200 (indicating proper alignment of the solder bumps 202 to the test cups 110), the pulsed flow of lubricating gas is halted, and vacuum is applied through the vertical supply holes 116 to hold the semiconductor die 200 in position. Generally, "satisfactory electrical contact" means that a force current/measure voltage test is performed to detect the presence of the signal I/O (input/output) ESD (electrostatic discharge) structures. This confirms all needed electrical contacts have been made in order to control and observe testing. Z axis movement of the test stage 102 toward the test probe 108 continues to a learned Z axis overdrive position. In some cases, additional Z axis overdrive is applied to compensate for differential thermal expansion effects caused by a combination of thermal control (heating or cooling) and heating due to power dissipated by the semiconductor die under test. The Z axis overdrive position is learned by trial and error and is set by test equipment technicians, in one or more embodiments.

In one or more embodiments the test stage 102 also includes the aforementioned slanted supply holes 118 and 119 in addition to the vertical supply holes 116. The slanted supply holes 118, 119 provide laterally pulsed gas in E, S, W, and N directions (along the X and Y axes), as shown in FIG. 2, for gently shaking the semiconductor die 200 in the x, y plane until engagement of the test cups 110 onto the solder bumps 202 laterally stabilizes the semiconductor die. The gentle shaking enhances fine alignment of the semiconductor die 200 to the test probe 108.

In one or more embodiments, the corner guides 114 rest on alignment pins 122. In other embodiments the corner guides 114 can be omitted and the alignment pins 122 can serve as the mechanical stops for coarse alignment of the semiconductor die 200 to the test stage 102.

FIG. 2 depicts, in top schematic view, the test stage 102 including the corner guides 114 and the supply holes 116, 118, 119 for fluidized alignment of the semiconductor die to the test probe. X, Y, and Theta axes are shown along with E, S, W, and N directional arrows for the slanted supply holes 118, 119.

Figure 3:
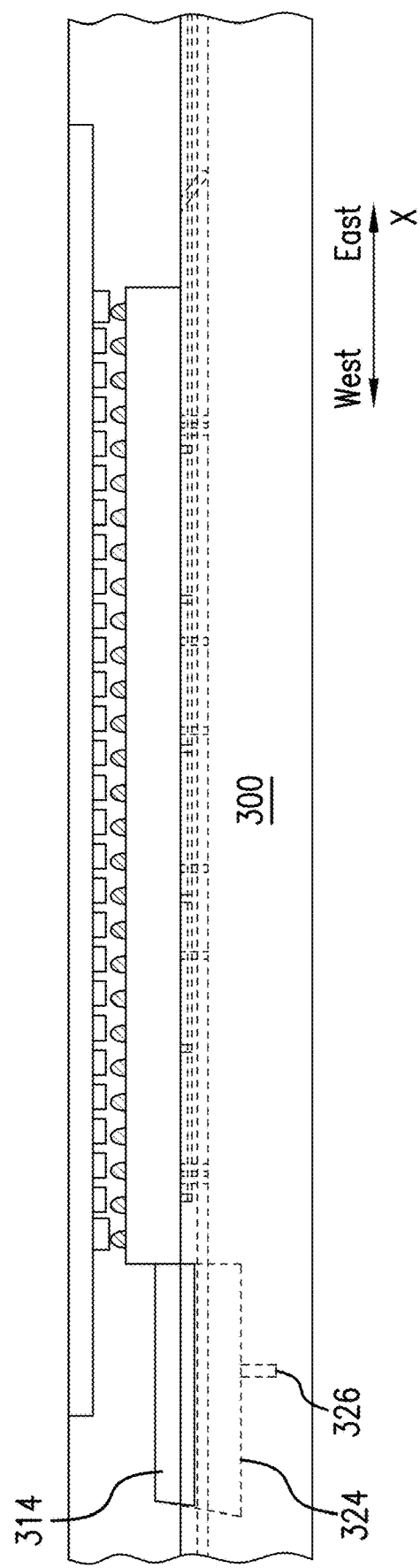
FIG. 3 depicts, in partial side schematic view, a test stage with retractable corner guides.

FIG. 3 depicts, in partial side schematic view, a test stage 300 with retractable corner guides 314. The corner guides 314 recess into alignment slots 324 and are pushed up out of the slots by compressed gas that is provided through pneumatic supply holes 326. Otherwise, the test stage 300 is similar to the test stage 102 of FIGS. 1 and 2.

Figure 4A:
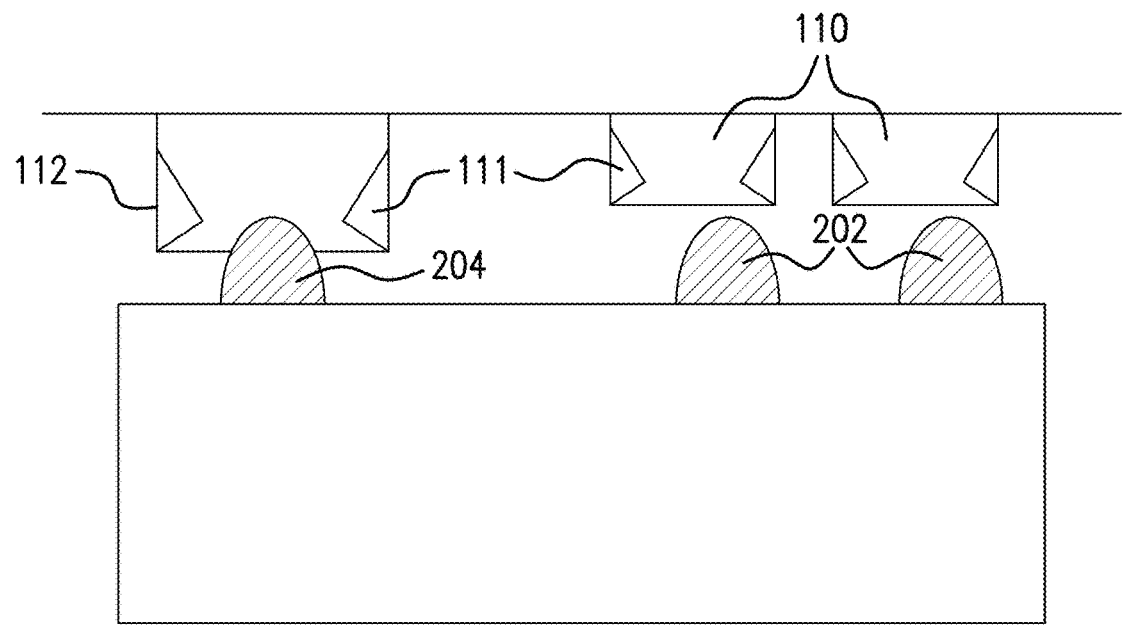
FIG. 4A depicts, in partial side schematic view, an arrangement of test cups and a guide cup on the test probe interacting with solder bumps on the semiconductor die.
Figure 4B:
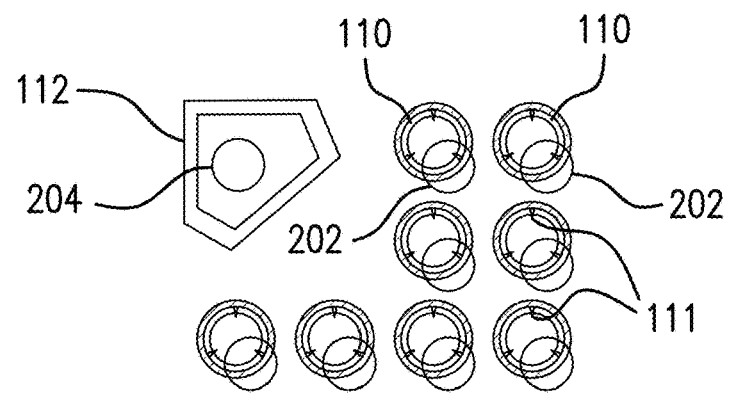
FIGS. 4B-4C depict, in partial top schematic view, unaligned and aligned configurations of the test probe with the solder bumps on the semiconductor die.
Figure 4C:
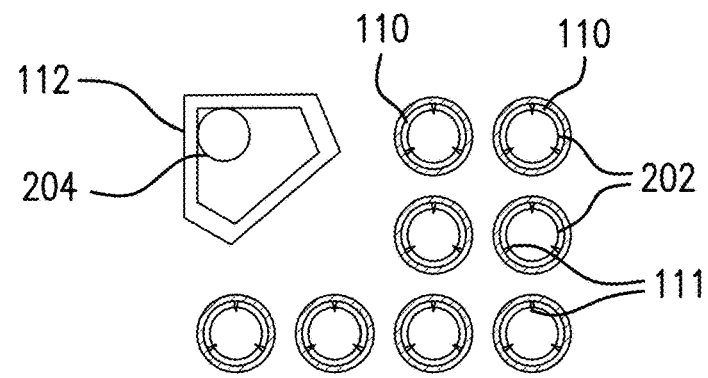

FIG. 4A depicts, in partial side schematic view, an arrangement of test cups 110 and a guide cup 112 on the test probe 108 of FIG. 1, interacting with solder bumps 202 of the semiconductor die 200 of FIG. 1. The test cups 110 are sized to receive the upper halves of C4 ("controlled collapse chip connection") solder balls. Current state of the art has solder balls (and pillars) with diameters of 30 microns on an array pitch of 150 µm. The test cups 110 are shown as open hemispheres but equally could be cylindrical, conical or frustoconical, or another shape compatible with the solder balls. The test cups 110 include internal prongs 111 for slightly penetrating into the solder balls for solid mechanical and electrical contact. The guide cup 112 is deeper and wider and projects further from the test probe 108 toward the semiconductor die 200, relative to the test cups 110. As a result, the guide cup 112 is the first structure of the test probe 108 that engages a solder bump 202 as the semiconductor die 200 is moved toward the test probe 108. This means that the interaction of the guide cup 112 with the corresponding solder bump 204 begins fine alignment of the semiconductor die 200 to the test probe 108, as shown in FIG. 4B. Further motion of the semiconductor die 200 toward the test probe 108 brings the other solder bumps 202 into contact with their corresponding test cups 110, thereby completing the fine alignment of the die, as shown in FIG. 4C.

Figure 5A:
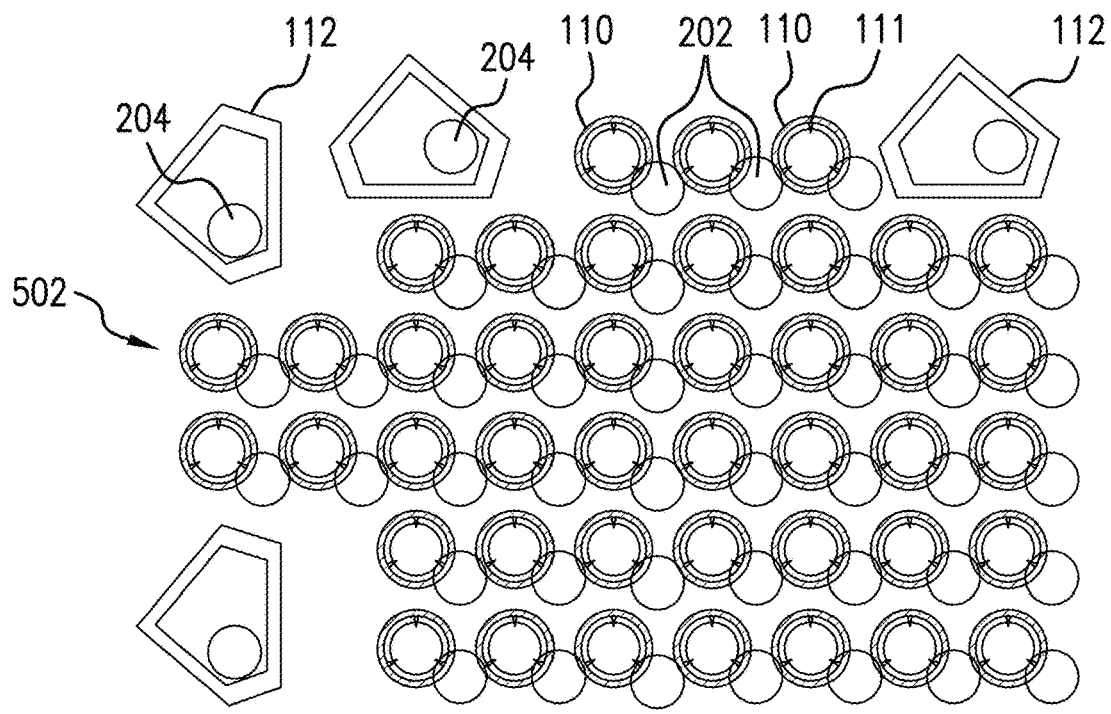
FIGS. 5A-5B depict, in partial top schematic view, an arrangement of test cups and alignment features on the test probe interacting with bumps on the semiconductor die as the test stage is raised from a pre-alignment position to a test position.
Figure 5B:
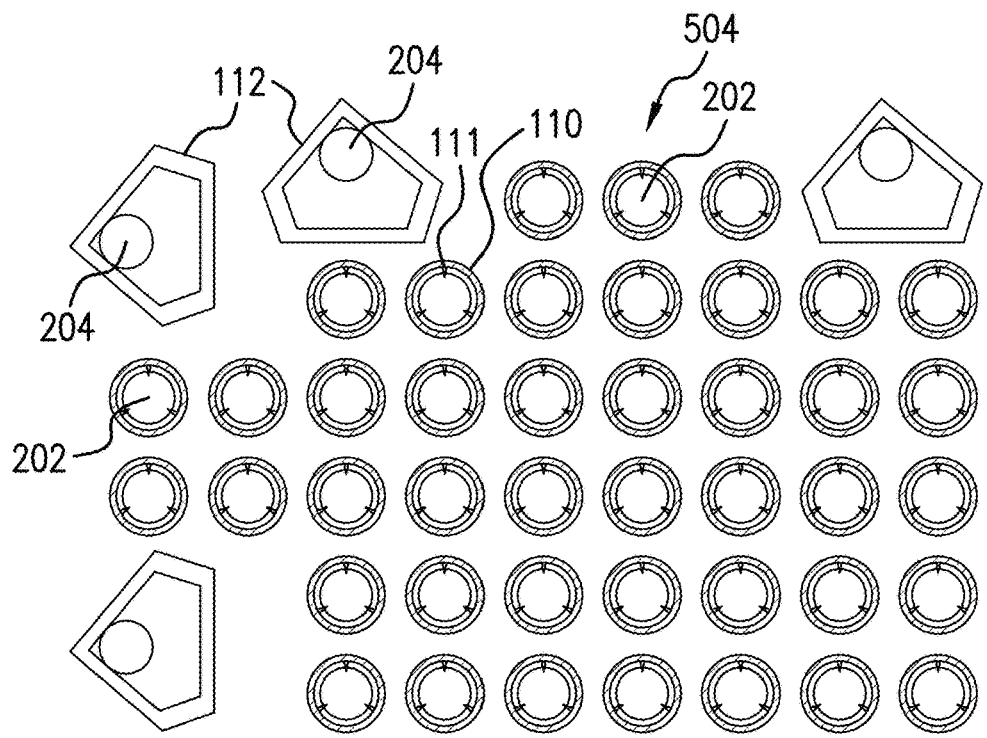

FIG. 5A depicts, in partial top schematic view, an arrangement of test cups 110 and guide cups 112 on the test probe 108 interacting with bumps 202 on the semiconductor die 200 as the test stage 102 is raised from a pre-alignment position that is distant from the test probe 108 toward a test position that is closer to the test probe 108. At 502 (FIG. 5A) the guide cups 112 have just begun to engage with their corresponding solder bumps 202. At 504 (FIG. 5B) the guide cups 112 and the test cups 110 are fully aligned and engaged in electrical contact with their corresponding solder bumps 202. Note that prongs 111 of the test cups 110 mechanically penetrate the solder bumps 202 in the fully engaged position. Note outward solder balls 204.

Figure 6:
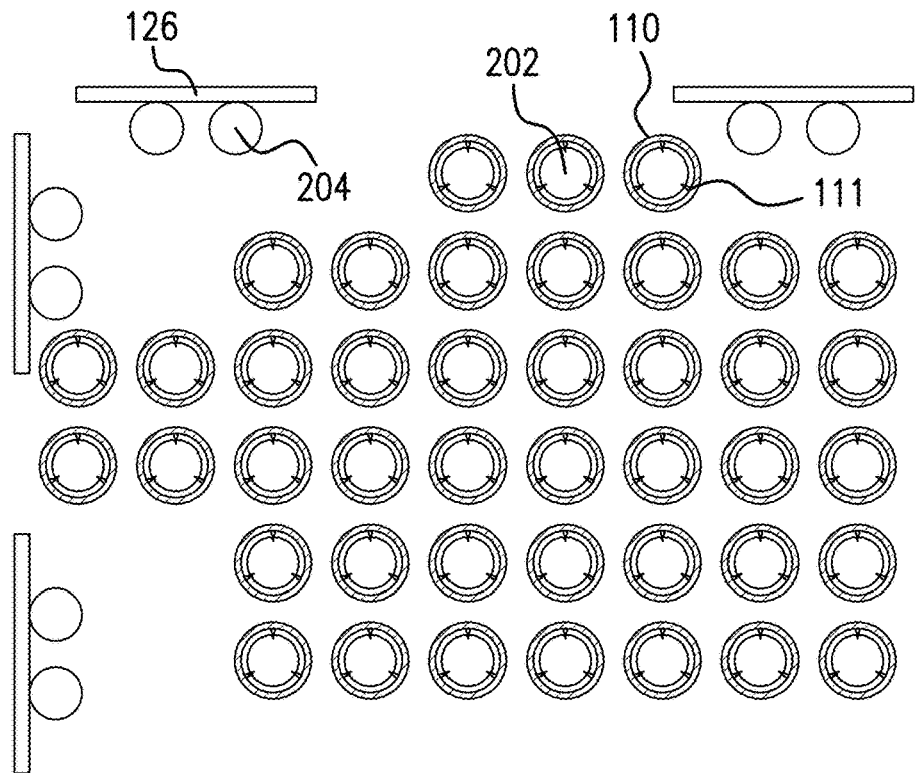
FIG. 6 depicts, in partial top schematic view, another arrangement of test cups and alignment features on the test probe interacting with bumps on the semiconductor die.

FIG. 6 depicts, in partial top schematic view, another arrangement of test cups 110 and alignment features 126 on the test probe 108 of FIG. 1 interacting with bumps 202 on the semiconductor die 200 of FIG. 1. In this embodiment the alignment features 126 are flat walls that contact the sides of outward solder bumps 204. Note prongs 111.

Figure 7:
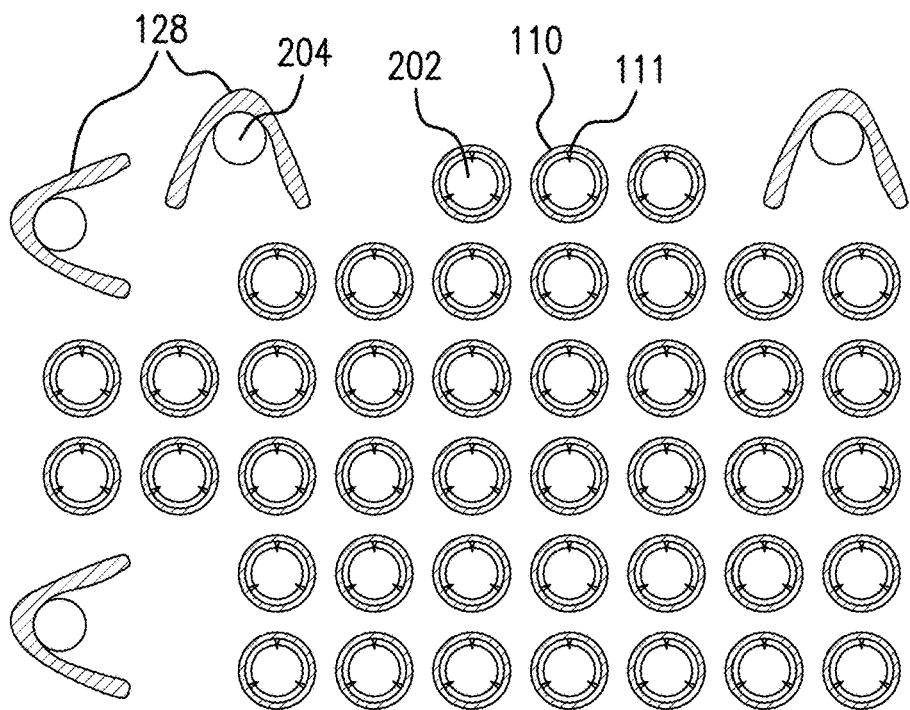
FIG. 7 depicts, in partial top schematic view, another arrangement of test cups and alignment features on the test probe interacting with bumps on the semiconductor die.

FIG. 7 depicts, in partial top schematic view, another arrangement of test cups 110 and alignment features 128 on the test probe 108 of FIG. 1 interacting with bumps 202 on the semiconductor die 200 of FIG. 1. In this embodiment the alignment features 128 are concave walls that open toward the center of the semiconductor die 200. Note outward solder balls 204 and prongs 111.

Figure 8:
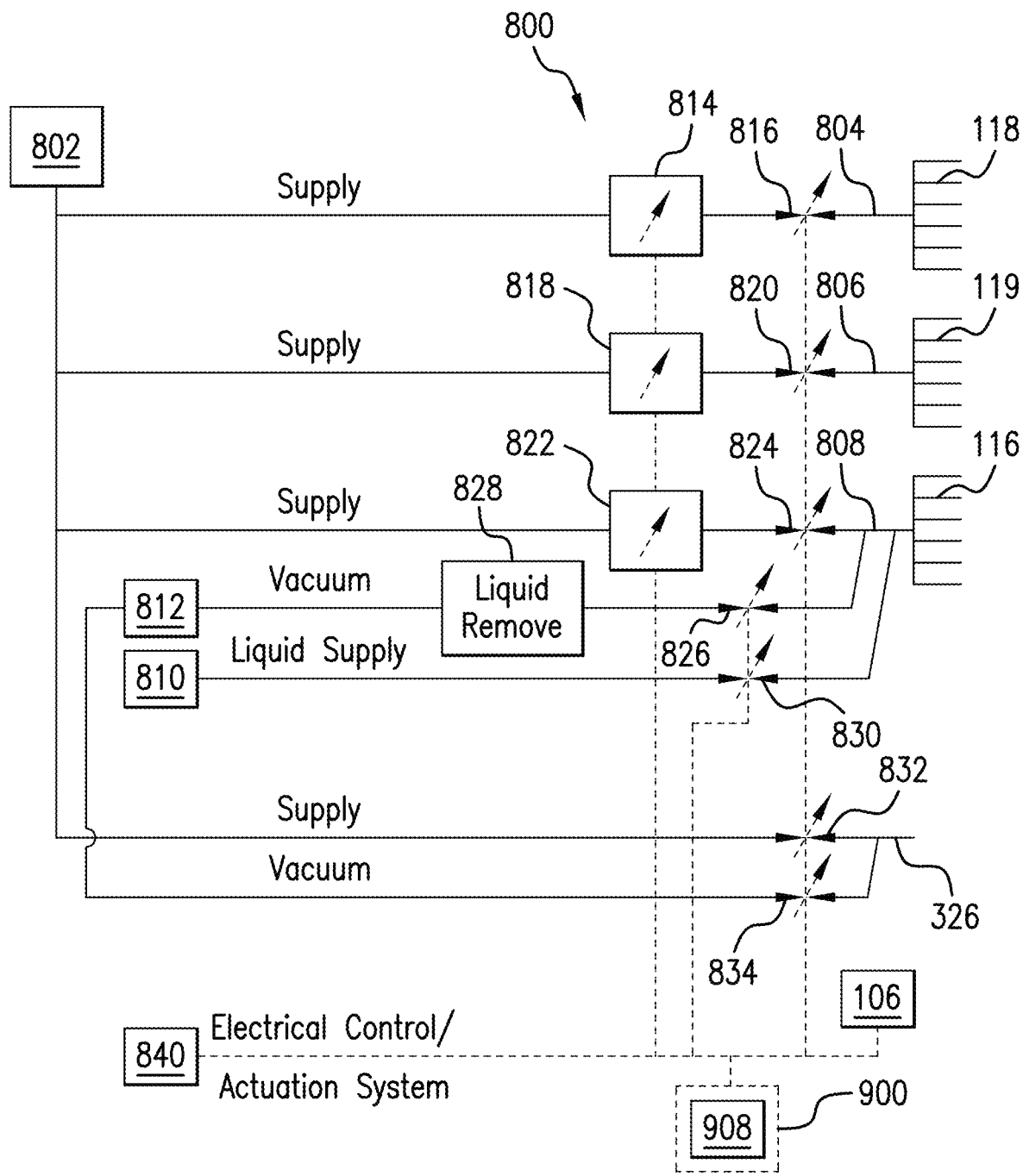
FIG. 8 depicts, in schematic view, a piping system for supplying and removing air and fluids through the test stage during alignment of the semiconductor die to the test probe.

FIG. 8 depicts, in schematic view, a piping system 800 for supplying and removing fluids through the test stage 102 during alignment of the semiconductor die 200 to the test probe 108. The piping system 800 connects a pressurized air supply 802 to (i) an E, S air gallery 804 that connects to the slanted supply holes 118; (ii) a W, N air gallery 806 that connects to the slanted supply holes 119; and (iii) a vertical gallery 808 that connects to the vertical supply holes 116. The piping system 800 also connects with a pressurized liquid supply 810 and a vacuum supply 812 for the vertical gallery 808. At least one valve connects each supply to the corresponding gallery, and a modulator or driver (such as an audio speaker) is provided to provide pulsed air as further discussed below. Thus, a modulator 814 and a proportional valve 816 connect the pressurized air supply 802 to the E, S air gallery 804; a modulator 818 and a proportional valve 820 connect the pressurized air supply 802 to the W, N air gallery 806; and a modulator 822 and a proportional valve 824 connect the pressurized air supply 802 to the vertical gallery 808. In one or more embodiments, a single modulator can be provided in place of the duplicate modulators 814, 818, 822.

Meanwhile, a proportional valve 826 and a liquid removal device 828 connect the vacuum supply 812 to the vertical gallery 808. A proportional valve 830 connects the liquid supply to the vertical gallery 808. Proportional valves 832, 834 respectively connect the pressurized air supply 802 and the vacuum supply 812 to the corner guide pneumatic supply holes 326. A process controller 840 is connected in electrical communication with the one or more modulators and the various valves, with the Z drive motor 106 of the test stage 102, and with a tool motor 908 of a pick and place tool 900 that is discussed with reference to FIG. 9. The process controller 840 operates the valves and motors to accomplish methods 1000, 1100, 1200, and 1300 that are further discussed with reference to FIGS. 10-13.

Figure 9:
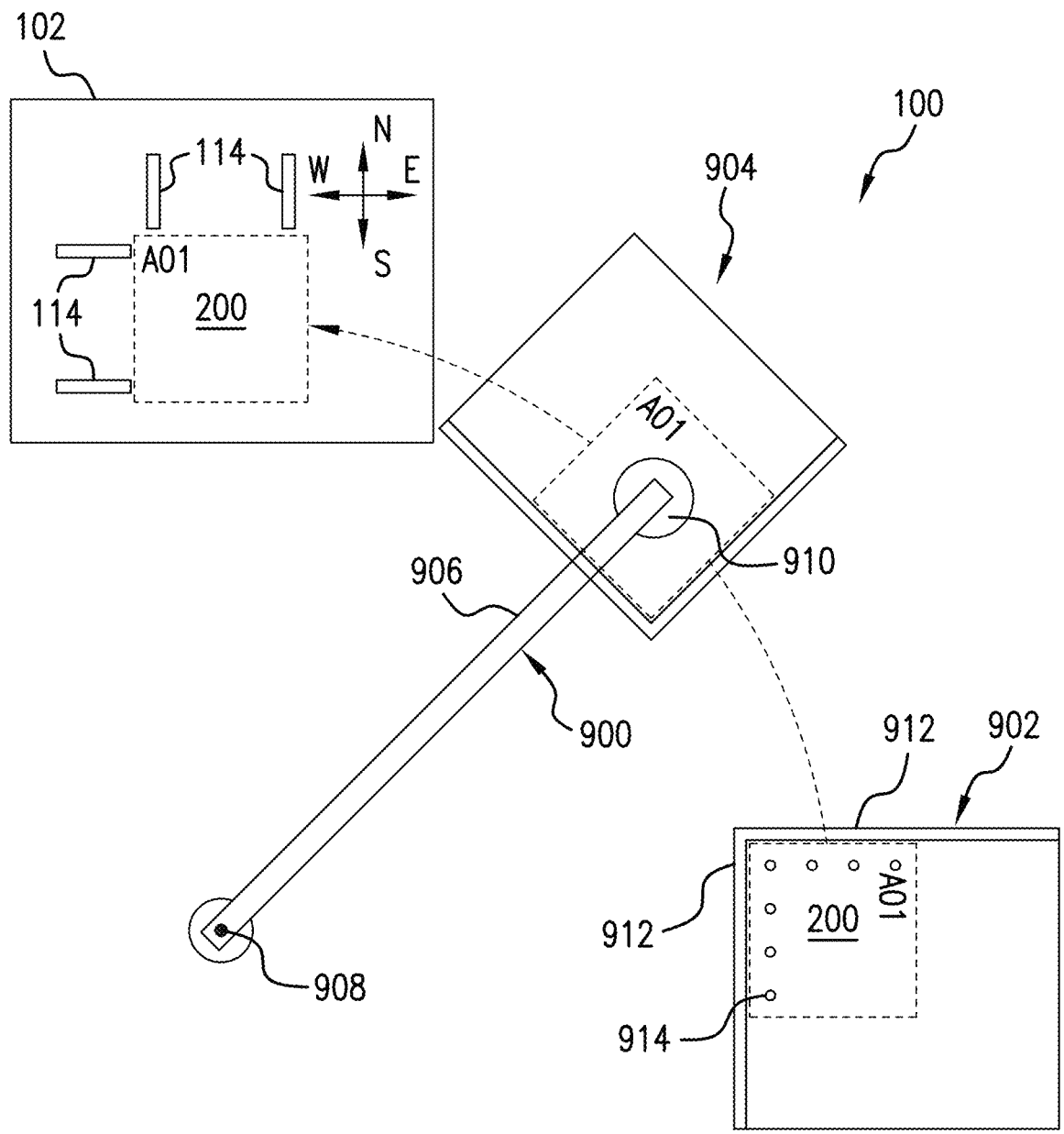
FIG. 9 depicts, in top schematic view, a pick and place tool and its operation for moving the semiconductor die from a coarse align stage to the test stage and back to a tested die stage.

FIG. 9 depicts, in top schematic view, the pick and place tool 900 and its operation for moving the semiconductor die 200 from a coarse align stage 902 to the test stage 102 and back to a tested die stage 904. The pick and place tool 900 includes the pick arm 906, the tool motor 908 at one end of the arm, and a pick head 910 at the end of the arm opposite the tool motor. The tool motor 908 has its axis generally parallel to the Z-axis in order to rotate the arm 906 around the Z axis and move the pick head 910 up and down parallel to the Z-axis. Of course, the tool motor could be oriented differently in other embodiments and can be provided with gearing, a rack-and pinion mechanism, or other well-known mechanical techniques to provide the desired rotation and translation. The pick and place tool 900 also includes a vacuum source (not shown) that connects to the pick head 910. The coarse align stage 902 includes a low fence 912 that defines a corner where the semiconductor die 200 is stationed at the start of the process. The coarse align stage 902 also includes vacuum ports 914 that open near the low fence 912.

According to exemplary embodiments, as shown in FIGS. 1-7, die-to-probe alignment is effected using mechanical stops (guide pins 122 or corner guides 114, 314) for reduced force coarse alignment of a die 200 to a test stage 102 during pick and place of the die onto the test stage, followed by a minimum energy method of fine alignment of the die 200 to a test probe 108 using pulsed air fluidization of the die on the test stage in combination with special Low Force Probe (LFP) contact geometry of the test probe. The interactions of the die 200 with the corner guides 114 or 314 enables coarse alignment of the die 200 to the test stage 102. Further interactions of the die 200 (e.g., corner solder bumps 204) with the special probe contact geometry 112, 126, 128 enables fine alignment of the die 200 to the test probe 108.

Interaction between solder balls 202 and test cups 110 results in the finest degree of alignment, without requiring X, Y, or theta mechanical translation mechanisms, which reduces the complexity and expense of the alignment mechanical requirements. Additionally, aligning the die 200 to the centroid of effort and force of the Z axis, minimizes Z off-axis forces, enabling a simpler Z axis stability solution. Furthermore, because electromechanical drives are not required for X, Y, theta translation and rotation, camera(s) and image processing also are not required to control such drives. It should be noted that the coarse and fine alignment method taught here can be used to align other types of probes, such as pogo probes, to an array of solder bumps, pillars or pads. In some embodiments, the test probe 108 may not have guide cups 112. In such embodiments, coarse alignment may be accomplished by the guide pins 122 or corner guides 114, while fine alignment is accomplished by minimum energy interaction of the test cups 110 with the solder balls 202. Thus, in at least some embodiments, the test cups 110 may also be "alignment features."

Coarse alignment is independent of the probe type. Fine alignment for pogo probes can be accomplished using the guides illustrated in FIGS. 4-7, with the vertical extent of the pogo probes restricted to a plane vertically higher than the guide structures. Once fine alignment is accomplished, in this aspect, the Z axis translates to bring the pogo probes into contact with the electrical contacts on the die under test. The minimum energy fine alignment is not a part of a pogo probe procedure in one or more embodiments, unless the pogo probes also have a cup tip. Generally, pogo probes may have a sharp, blunt, chisel or 'star' chisel tip. Typically, the sharp tip is used for C4 probing.

The die pick and place coarse alignment is accomplished by using a low force translation mechanism (e.g., vacuum pick 900, shown in FIG. 9) to pick, from a coarse aligned location 902, a die 200 that is bump side up. The low force (flexible) place arm swings the die into proximity of locating guide pins 122 or corner guides 114, lowers the die to the thermal control surface 104 where pulsed gas is used to lubricate the motion of the die, and a small amount of tension is applied to the place arm 906 to swing the die into alignment against the guide pins. (In one or more embodiments, "low force" means that translational force at the pick head 910 in the XY plane is limited to no more than about $10^{-5}$ times the force used to engage the test cups onto the solder balls 202. By having low torque on the rotational axis/low force in the XY plane, range of motion of the pick tool 900 is limited by mechanical interference rather than relying on position sensor feedback.) Once the process controller 840 detects that the die 200 has seated against the guide pins (e.g., by detecting that the tool motor 908 is not incrementing its position), then die fluidizing gas is shut off and vacuum is engaged at the test stage 102, holding the die in position against the thermal control surface while the pick vacuum is shut off, pick lifted and swung out from between test stage and probe. The guide pins then may be retracted.

Minimum energy fine alignment of the die 200 to the test probe 108 is then accomplished using a low force probe guide 112 that is, in one or more embodiments, similar to the open end of a test cup 110. As the test stage 102 is raised toward the test probe 108, the guide cup 112 engages at least a portion of a solder ball 202 at a corner of the die 200. Note that a common practice used by wafer probes is to translate the wafer to the probe; in package part testing it also is typical for the part to be moved into the probe array; however, there is no particular reason why the motion could not be reversed with a moving test probe being lowered toward a stationary test stage. Note, also, that guide structures other than the guide cups 112, as shown in FIG. 4A, would not necessarily contact a solder ball or pillar during the initial fine alignment. Instead, fine alignment could be carried out in other embodiments by simply raising the test stage 102 toward the test probe 108 until the solder balls 202 begin to engage into the test cups 110. From a coarsely aligned position in which the test cups 110 overlap the solder balls 202 by at least 50%, and in which first electrical contact is made, a fluidized air bed is provided for the die 200 as discussed herein while the die seeks an alignment that has the solder balls 202 fitting into the test cups 110 with a minimum contact energy.

In one or more embodiments, during fine alignment, the test stage 102 carrying the die 200 is vertically translated through a learned fixed distance toward the test probe 108. The fixed distance can be learned by translating the test stage 102 along the Z axis, with the die 200 deliberately offset from its optimum position. Between incremental Z axis up-down cycles, the die is inspected for marks made by the probe. Once marks are observed, the initial Z axis motion is known. For instance, using a non-functional sample die, which has been sawn to be slightly too large, will force the probe to initially land in an offset location when the probe will impose a lateral force on a solder bump or pillar.

Alternatively, if the fine align guide structure (e.g., test cups 110) is electrically connected to an impedance measurement instrument, then the fixed distance can be learned by observing an electrical parameter (e.g., impedance) to detect a first electrical contact between the die 200 and the test probe 108 while the test stage 102 is moved along the Z axis toward the test probe 108.

Following first electrical contact, a reverse Z motion can be imposed on the test stage 102 to ensure that the die 200 is not being held down by the test probe 108. The small reverse Z motion is learned by trial and error. Since there is not meaningful compliance between probe 108 and guide 112, reversing the axis motion by an amount greater than the axis hysteresis will separate the probe guide from the probed object, if in fact there is interference overlap (expected for circular probe guide 112). Each different tool may have variation in Z axis hysteresis and such hysteresis may change slightly over time. In one or more embodiments, test equipment engineering technicians will determine how often re-learning of the Z axis motions is necessary.

After the reverse Z axis motion, the vacuum holding the die to the test stage is released and replaced with pulsed gas under the die. The effect of the pulsed gas under the die is to fluidize the die with respect to the probe as the test stage 102 is slowly (e.g., no more than 2000 micrometers per second or even no more than 200 micrometers per second) raised toward the test probe 108. Generally, "slowly" refers to how the controls of the Z axis are manipulated. If the motor is digitally controlled and the incremental setting accuracy of the Z axis is 0.1 micron, the command to translate may be sent, for example, as move 2 increments, followed by a similar increment. Spacing out the timing of the reiterated command "slows" down or speeds up the motion. Additionally, some digital translation motors have torque controls which affect how quickly motion occurs. Servo type motors have acceleration and constant rate parameters which can be set directly. How slowly or quickly the stage is moved is a learned quantity. An example value is move Z up at a rate of 20 microns per second until first electrical contact. Then move Z up at a rate of 2 microns per second for 5 seconds, then move Z up at 20 microns per second for 30 microns. Then apply learned overdrive.

The guide cup 112 can be either the nominal test cup size or a specially oversized cup, circular and similar to but larger in width and height than the test cups 110. Because the Z axis was lowered slightly, physical contact was broken between solder bump and probe. Once the vacuum is released and the modulated (pulsed) air is introduced the die will "float" upward, but the guide cup 112 will constrain the motion of the die 200. As the test stage 102 is slowly raised the test cups 110 also will constrain the motion of the die 200.

Thus, in one or more embodiments the die 200 has an alignment where more than one half of a solder ball, as positioned by the guide pin based coarse alignment, is within the projection of the area of the guide cup 112. Alternatively, once a guiding structure (e.g., 126 as shown in FIG. 6, 128 as shown in FIG. 7) has been aligned with the solder ball at the corner of the die, the array of test cups 110 is lowered onto the array of solder balls 202 while providing pulsed air under and optionally at edges of the die 200. Minimum energy alignment of the solder ball array to the test cups occurs as the test stage 102 is raised along the Z axis, where the die remains fluidized and seeks its minimum energy location, which is where the solder balls or pillars are within the circular test cups 110 of the low force probe 108.

Figure 15:
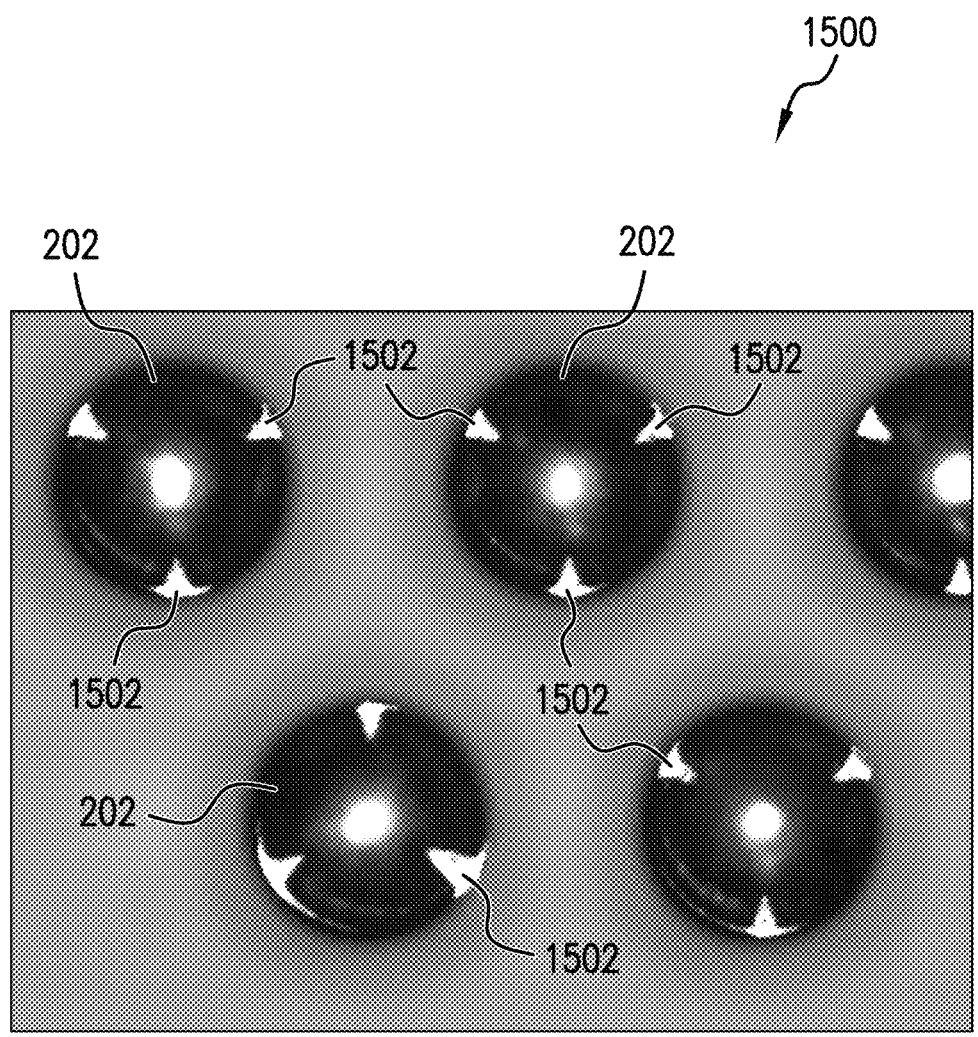
FIG. 15 depicts a photomicrograph of marks made on solder balls that indicate sufficient mechanical contact between the solder balls and test cups of a test probe.

As the solder balls 202 enter the test cups 110, small projections 111 inside the cups gradually cut into the softer solder material forming a metal-to-metal electrical contact. The die 200, whose motion is constrained by the geometry of the test cups 110, will seek a position which minimizes the energy of the system. That position is where the solder bumps of the die are located centrally within the cup probe structure of the probe array. During the fluidized stage of the alignment process, additional directed jets of fluidizing gas may be directed at the edge of the die to promote horizontal fluidized behavior. The fluidizing gas flow continues while the die is translated in the Z axis toward the test probe. When the die reaches a position known to be sufficient for the probe having captured the solder balls, the fluidizing gas is shut off. The Z axis motion then is completed to a learned overdrive position. The amount of overdrive is learned by trial and error, where a probe contact cycle is done at an estimated amount (initial learned value+some amount equal to, for instance 20% of the diameter of the solder ball element of the array) and the die inspected for appropriate probe contact marks. FIG. 15 depicts a photomicrograph 1500 of solder balls 202 with indentations 1502 that were produced by adequate or sufficient contact between the solder balls 202 and test cup prongs 111 (shown, e.g., in FIG. 4A).

During test there is no need for vacuum or fluidized gas. However, the gas ports under the die can be used to supply thermal interface enhancement in the form of a heat transfer liquid (e.g., pentadecane) or gas (e.g., helium). Heat transfer fluid can be scavenged later via the same gas/vacuum delivery ports or via dedicated fluid delivery and scavenge ports (not shown).

After test, the gas ports 116 are used to apply a vacuum to hold the die 200 in place as the test stage 102 is translated in the Z direction away from the test probe 108.

Probe systems generally have a removal force related to the probe geometry, strain kinetics and atomic scale surface adhesion. If the removal force exceeds that supplied by the vacuum hold down, then either dynamic motion or liquid introduced under the die may be used to enhance the retention of the die to the stage during removal of the die from the probe.

"Dynamic motion" refers to operating the Z axis with high acceleration for a short distance, e.g., 500 microns. In so called steady state analysis, a perfect vacuum under the die 200 will limit the retention force to the area of the die times atmospheric pressure. In dynamic motion, on the other hand, if the acceleration is large enough, then the viscosity of air prevents ingress of air between the die and the test stage and momentarily increases the retention force that holds the die against the test stage. This happens because the planar back surface of the die is close to being optically smooth and is against a polished planar surface of the stage/heatsink. Asperities will govern the height of the space between the two planar surfaces. Hence, ingress of gas between the die and the test stage is restricted to a very small region. Gasses behave differently when their motion is confined. An analogy is electrical currents which can become denser due to the combination of geometry and electromotive force (i.e. current crowding).

By contrast to the narrow separation between the die and the test stage, the solder ball or pillar array contact with the test cups does not seal the perimeter of the ball to the cup. Instead the ball is forced to the center of the cup by the force of the 3 intra-cup blades (above-discussed projections 111). Additionally, the space between the planar surface of the die and the planar face of the probe structure is on order of one half the diameter of the solder ball (assuming the test cups are indented into the probe). Thus, the space between the die and the test probe is large compared to the space between the die and the test stage, so that ingress of gas between the die and the test probe has a larger flow path. Based on the difference in geometries, air viscosity effects between the test stage and the die would be much greater than air viscosity effects between the die and the test probe.

Introduction of liquid under the die (e.g., a heat transfer enhancer such as pentadecane that has a much higher boiling point and much lower vapor pressure and is more viscous than water) also increases the amount of force needed to lift the die from the test stage. Also due to viscosity effects, but because of the large difference in density/viscosity between gas and liquid, the liquid associated mechanical time constant is much longer so that the test stage—liquid—die system responds as a monolith for short movements in small time scales (i.e., micrometers and milliseconds).

To remove the die 200 from the test stage 102, once the test stage and test probe 108 have been moved apart, a pick arm 906 (as shown in FIG. 9) swings into place over the die 200, is lowered, and pick vacuum is turned on to a pick head 910. The vacuum ports under the die 200 are turned off and fluidizing gas turned on. The pick arm 906 is raised and swung out from between the test stage 102 and the test probe 108 to a tested die stage 904. The die 200 is lowered onto the tested die stage, the pick vacuum is released, (optionally reversed), and the pick arm is lifted and swung to the incoming die pick location.

These preceding general steps are accomplished by a system such as the test apparatus 100 described above.

Figure 10:
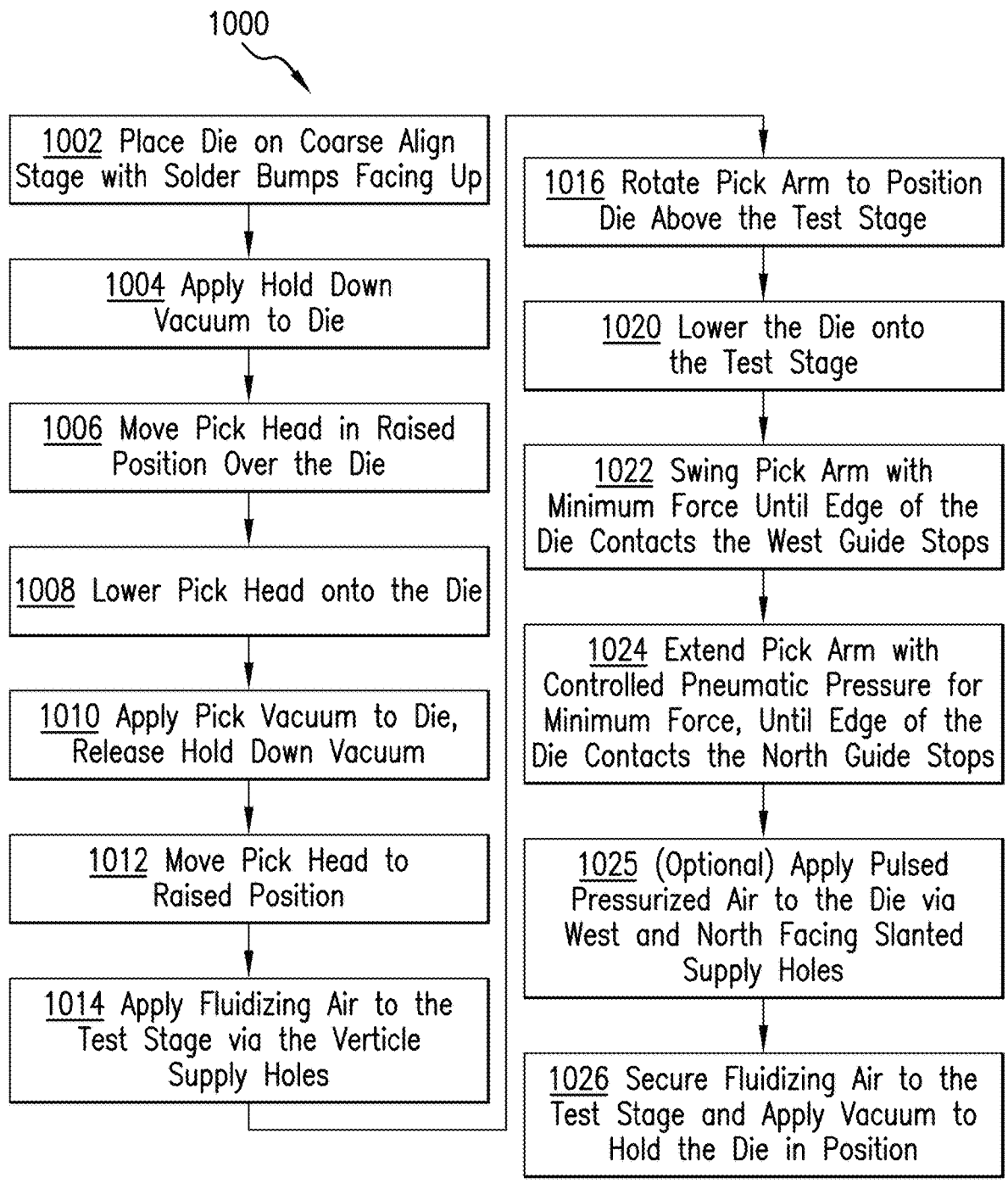
FIG. 10 depicts, in a flowchart, a method for placing and coarse aligning the semiconductor die on the test stage.

FIG. 10 depicts, in a flowchart, a method 1000 for placing and coarse aligning the semiconductor die 200 on the test stage 102. At 1002, the die 200 begins in place on the coarse align stage 902 with its edges against the low fence 912 (shown in FIG. 9) and with its solder bumps facing up. At 1004, hold down vacuum is applied to the semiconductor die 200 via the vacuum ports 914 (shown in FIG. 9). At 1006, the pick head 910 is in its raised position and moves over the center of the semiconductor die 200. At 1008, the pick arm 906 is lowered. At 1010, pick vacuum is applied through the pick head 910 and the hold down vacuum is released. At 1012, the pick head 910 moves to its raised position. At 1014, fluidizing air is applied to the test stage 102 via the vertical supply holes 116. At 1016, the pick arm 906 rotates to position the semiconductor die above the test stage so that the north edge of the semiconductor die 200 clears the north guide stops 114 and the west edge of the semiconductor die stops short of the west guide stops 114.

At 1020, the pick arm 906 lowers the die 200 onto the test stage 102. At 1022, the pick arm 906 continues to swing with minimum force until the edge of the semiconductor die 200 contacts against the west guide stops 114. This final rotation has very little force. At 1024, the pick arm 906 extends north to push the semiconductor die 200 against the north corner guides 114, using controlled pneumatic pressure, for example, for very little force. The coarse guides 114 stop the motion of the semiconductor die 200. In one or more embodiments, the pick head 910 is slightly flexible, allowing the die 200 to rotate and work squarely into a corner formed by the guides 114. At 1026, fluidizing air flow is halted and vacuum is applied through the vertical supply holes 116 to hold the semiconductor die 200 in position on the test stage 102. Optionally, at 1025 pulsed pressurized air may be supplied via the west and north facing slanted supply holes 119 during transition from float to vacuum, thereby urging the die 200 against the corner guides 114. The coarse alignment is accurate to approximately one half of a bump diameter.

Figure 11:
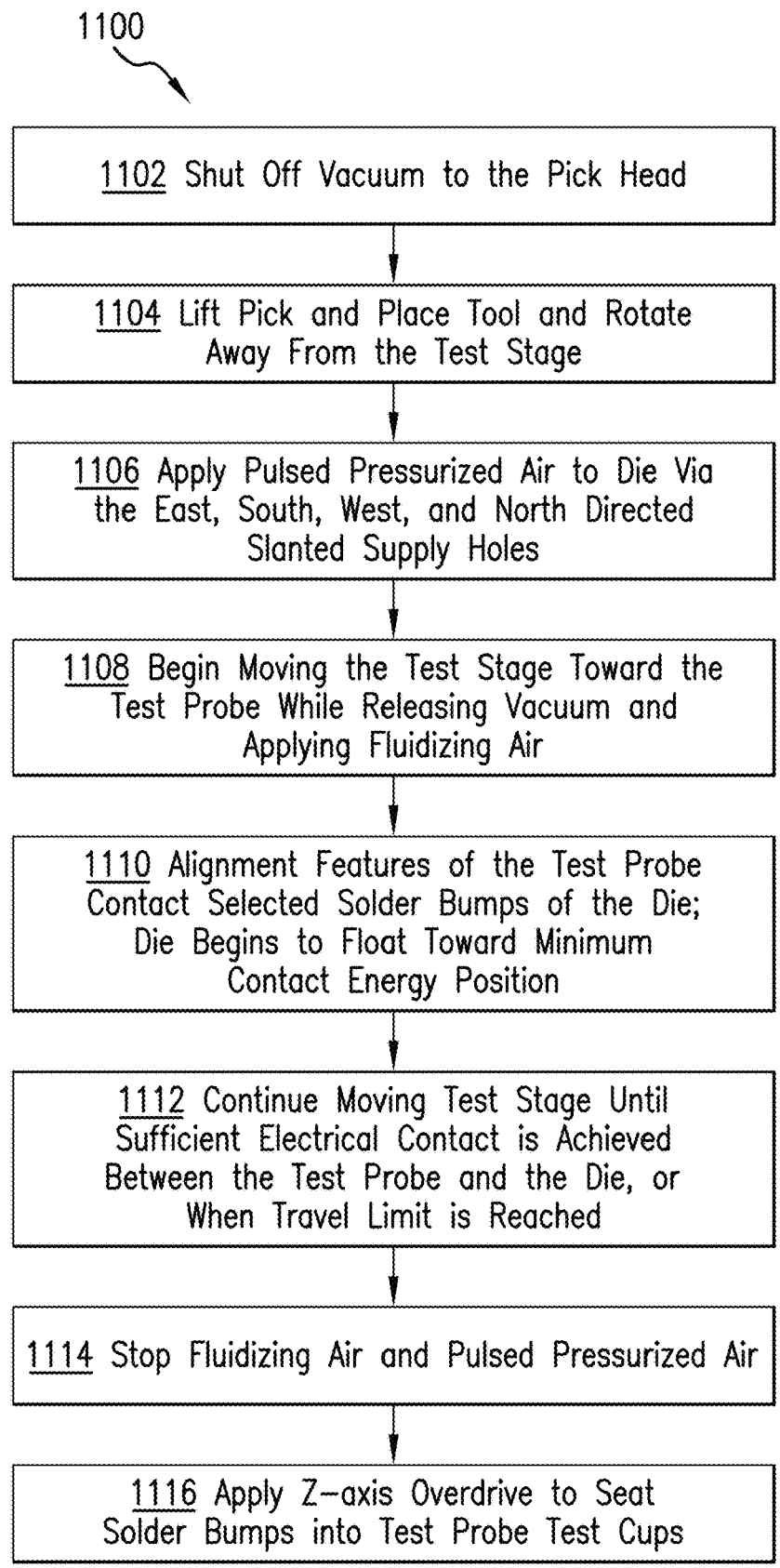
FIG. 11 depicts, in a flowchart, a method for fine aligning the semiconductor die to the test probe.

FIG. 11 depicts, in a flowchart, a method 1100 for fine aligning the semiconductor die 200 to the test probe 108. At 1102, vacuum to the pick head 910 is shut off to release the semiconductor die 200 from the pick and place tool 900. At 1104, the pick and place tool 900 is lifted and rotated away from the test stage 102. At 1106, pulsed pressurized air is applied to the semiconductor die 200 via the west and north directed slanted supply holes 119. At 1108, the test stage 102 begins moving toward the test probe 108. At 1110, the alignment features 112, 126, or 128 of the test probe 108 contact selected solder bumps of the semiconductor die 200. Once first electrical contact is made via the alignment features, vacuum through the vertical supply holes 116 is released and fluidizing air is applied. The fluidizing air is modulated (pulsed) so that it does not float the semiconductor die 200 entirely off the test stage 102. The slanted jets from supply holes 118, 119 may all be pulsed together, or may all be shut off, according to what is learned to work best. The semiconductor die 200 begins to float to a minimum contact energy position as the test stage 102 continues to be gradually raised toward the test probe 108. At 1112, continue moving the test stage 102 until sufficient electrical contact is achieved between the test probe 108 and the semiconductor die 200, or when a travel limit is reached. At 1114, fluidized air and angled air are stopped, and at 1116, a Z-axis overdrive is applied to firmly seat the solder bumps of the semiconductor die 200 into the test cups of the test probe 108. The fine alignment is accurate within the difference of diameters between the test cups and the solder bumps.

Figure 12:
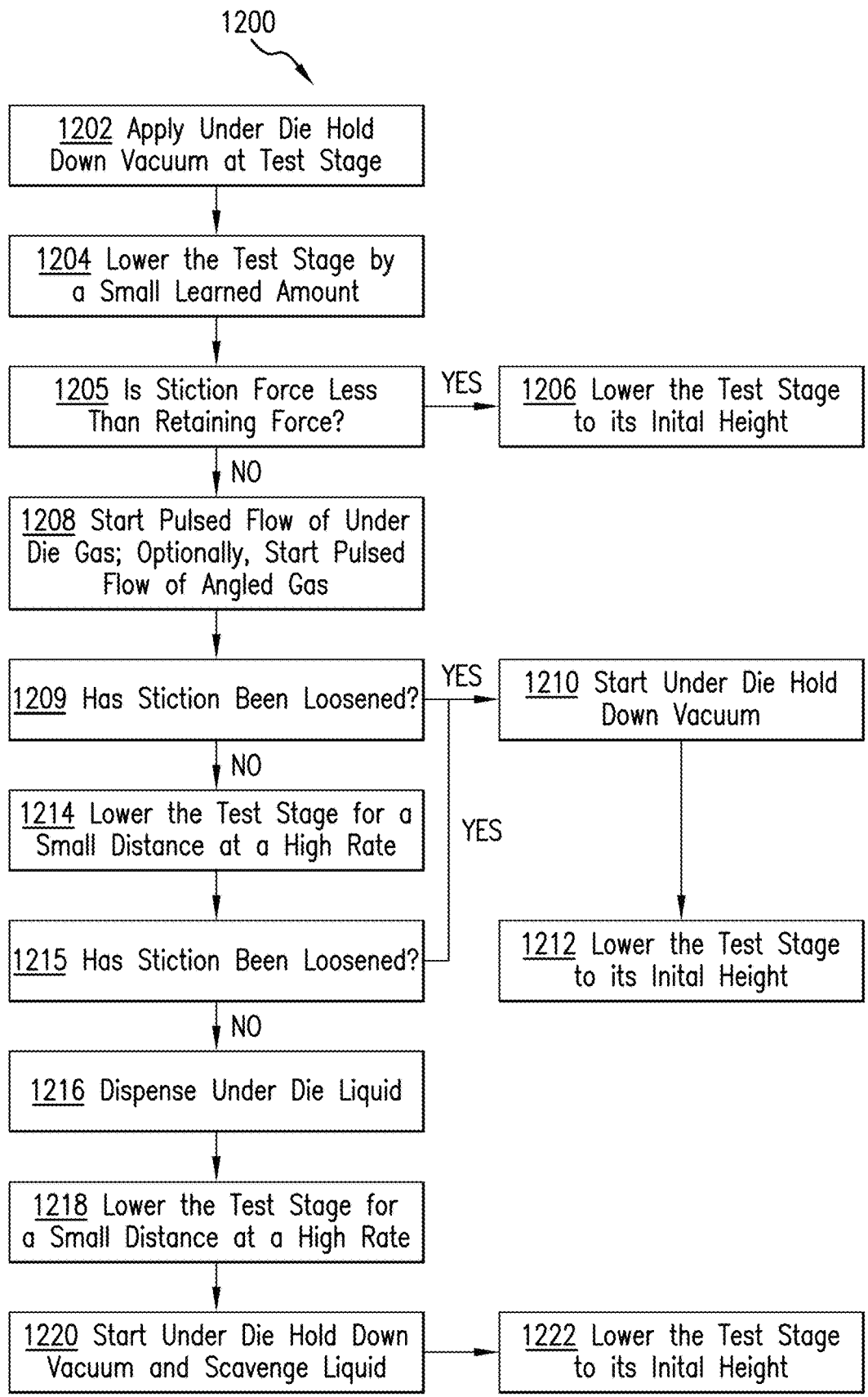
FIG. 12 depicts, in a flowchart, a method for removing the semiconductor die from the test probe.

FIG. 12 depicts, in a flowchart, a method 1200 for removing the semiconductor die 200 from the test probe 108. At 1202, under die hold down vacuum is applied via the vertical supply holes 116. At 1204, the test stage 102 is lowered by a small learned amount, e.g., by the Z-axis overdrive distance or by one eighth of a solder ball diameter. Generally, a specific die and probe produce reasonably repeatable behavior. Accordingly, the amount by which the test stage 102 should be lowered is learned by experimentation. If the semiconductor die 200 separates from the test probe 108 (as indicated by electrical contact being severed between the probe and the die under test), then at 1205 it is determined that a "stiction" force between the die and the test probe is less than the retaining force of the under die vacuum that holds the die down to the test stage 102. ("Stiction" is a force that holds two surfaces together in a direction normal to the surfaces. It is determined in part by surface roughness, by surface hardness, by chemical adhesion, and by other factors). In this case, at 1206 (YES branch of decision block 1205) the test stage 102 is lowered to its initial height. Note that blocks 1205, 1209, and 1215 are decision blocks but are depicted as ordinary rectangular blocks for purposes of illustrative compactness.

On the other hand (NO branch of block 1205), the "stiction" might exceed the vacuum retaining force. In one or more embodiments, this can be detected by noting continued electrical contact between the die 200 and the test probe 108 as the test stage 102 is lowered. Alternatively, the Z axis motor torque can be set based on the size of the die, with some learned offset, to not exceed the die to stage retaining force developed by atmospheric pressure. If the stiction retaining force is greater than the allowed motor torque, then the motor will not be able to pull the die away from the probe. Lack of incrementing motor position is used to detect this condition. In case the stiction exceeds the retaining force, one technique proceeds as follows: At 1208 the under-die vacuum is stopped and a pulsed flow of under die gas is started. The gas pressure is modulated differently than for the fine alignment—rather than fluidizing loose die motion, the gas is pulsed to loosen the "stiction".

Generally, the pulsed gas flow under the die can be modulated by a driver or modulator such as an audio speaker that is disposed in fluid communication with the air galleries 804, 806, 808. For example, the pulsed gas flow for fine alignment of the die to the test probe is modulated at about 1000 Hz and about 40 dB around a baseline pressure of about 10132 Pa (about 1.5 psi). On the other hand, the pulsed gas flow for shaking the die loose from the test probe is modulated at about 10 Hz at greater amplitude (e.g., about 80 dB) around a baseline pressure of about 101325 Pa (about 15 psi). It may also be learned that pulsing the angled gas jets can enhance die removal from the test probe.

After it is detected at 1209 that stiction has been loosened (YES branch of decision block 1209—either by detecting electrical separation of the solder balls from the test cups, or by detecting downward motion of the test stage 102 with limited torque applied at the Z drive motor), then at 1210 the under die vacuum is started and at 1212 the test stage is lowered to its initial height.

Another technique to be used when "stiction" exceeds the vacuum retaining force proceeds as follows: At 1209, the semiconductor die 200 does not separate from the test probe 108 while the vacuum retention is enabled (NO branch of decision block 1209). At 1214 the test stage 102 is lowered at a high acceleration, e.g., 0-5 micrometers in 1 millisecond at constant acceleration (the acceleration can be determined from the formula $s=\frac{1}{2} at^2$, in consistent units, where s=distance, a=acceleration, and t=time; m, m/s$^2$, and s in SI units, respectively) It should be noted, the retention force using this method can only be maximized to near atmospheric pressure. Lowering the test stage 102 at a high acceleration generally causes the semiconductor die 200 to be retained on the test stage (and separate from the test probe) due to viscosity of air preventing air entering between the test stage and the die. If at decision block 1215 (YES branch) it is confirmed that the "stiction" has been loosened, then hold down vacuum is continued as the test stage is lowered to its initial height (steps 1210, 1212).

Otherwise (NO branch of decision block 1215), another technique uses the viscosity and incompressibility of liquid to enhance retention of the semiconductor die 200 on the test stage 102. At 1216, under die liquid is dispensed via the vertical supply holes 116. Then at 1218 the test stage 102 is lowered at a high acceleration through a small distance (e.g., 50 microns). The resistance of the liquid to movement of the die away from the test stage retains the die on the test stage, causing separation from the test probe. At 1220, under die vacuum is applied and the liquid is scavenged through the vertical supply holes 116. Then at 1222, the test stage is lowered to its initial height.

Figure 13:
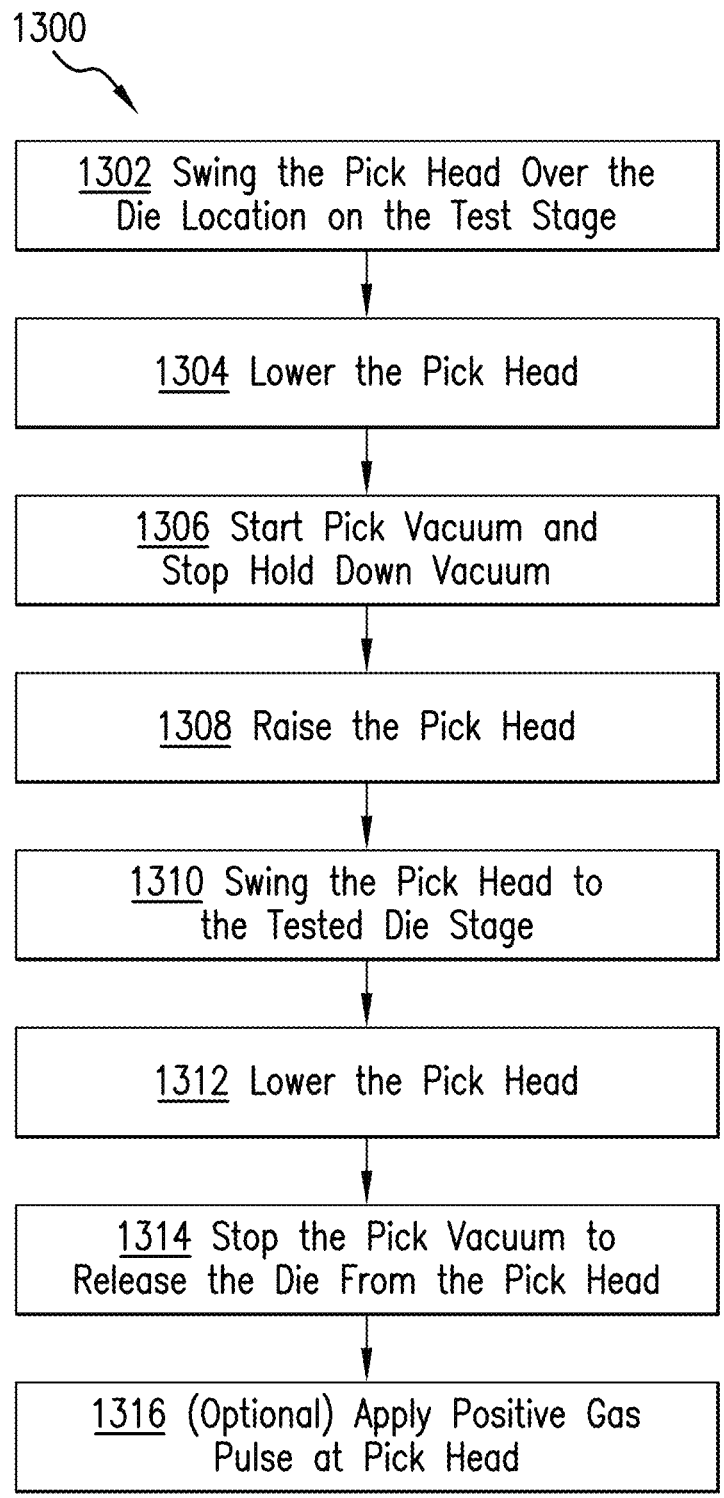
FIG. 13 depicts, in a flowchart, a method for removing the semiconductor die from the test stage.

FIG. 13 depicts, in a flowchart, a method 1300 for removing the semiconductor die 200 from the test stage 102. At 1302, the pick arm 906 swings the pick head 910 over the die location on the test stage. At 1304, the pick head 910 is lowered. At 1306, pick vacuum is started and under die hold down vacuum is stopped. At 1308, the pick head 910 is raised. At 1310, the pick arm 906 swings the pick head 910 out to the tested die stage 904. At 1312, the pick head 910 is lowered. At 1314, the pick vacuum is stopped to release the die from the pick head. Optionally, at 1316 a positive gas pulse is applied to dislodge the die from the pick head.

Given the discussion thus far, and with reference to the accompanying drawing figures, it will be appreciated that, in general terms, an exemplary method, according to an aspect of the invention, includes at 1020 placing a semiconductor die 200 onto a flat upper surface 104 of a test stage 102 with solder balls 202 of the die facing upward, fluidizing motion of the die with reference to the test stage by pulsing gas between the die and the upper surface of the test stage, and at 1022, 1024 coarse aligning the die with reference to the test stage by moving the die until adjacent edges of the die contact corner guides 114 that are disposed on the test stage. Further, at 1108 the method includes raising the test stage toward a test probe until at 1110 an alignment feature of the test probe engages a first solder ball of the die, and at 1112 fine aligning the die with reference to the test probe by continuing to raise the test stage until a second solder ball of the die fits into a test cup of the test probe.

In one or more embodiments, the method also includes 1025 pulsing gas against edges of the die to further fluidize its motion with reference to the test stage. In one or more embodiments, the method also includes 1026 stopping the pulsed gas and applying vacuum under the die between coarse aligning and raising the test stage.

In one or more embodiments, the method also includes 1108 releasing the vacuum and restoring pulsed gas under the die after the alignment feature 112 engages the solder ball 204 but before the test cups 110 engage the other solder balls 202. In one or more embodiments, the method also includes 1114 stopping the pulsed gas after the solder balls 202 fit into the test cups 110.

In one or more embodiments, the method also includes 1112 continuing to raise the test stage and continuing to provide pulsed gas under the die until a plurality of solder balls of the die fit into a plurality of test cups of the test probe.

In one or more embodiments, the method also includes halting motion of the test stage upon detecting adequate electrical contact between the test cups and the solder balls.

In one or more embodiments, the method includes at 1202, 1204 separating the die from the test probe by applying vacuum under the die and lowering the test stage away from the test probe. However, in case these steps are not sufficient to separate the die from the test probe, then the method also includes at 1208 loosening stiction between the die and the test probe by pulsing gas under the die. Optionally, the method also includes loosening stiction by applying pulsed gas to edges of the die while pulsing gas under the die. In case these steps are not sufficient to separate the die from the test probe, then at 1216, 1218 the method also includes separating the die from the test probe by applying pressurized liquid between the die and the test stage and rapidly lowering the test stage away from the test probe.

According to another aspect of the invention, an exemplary apparatus 100 includes a test probe 108 that has an array of test cups 110 at an underside of the test probe, each test cup having a downward opening; at least one alignment feature 112, 126, or 128 that protrudes from the underside of the test probe beyond the openings of the test cups; and a test stage 102 that has an upper surface 104 confronting the underside of the test probe and that is movable by a Z drive motor 106 along a Z-axis toward and away from the test probe.

In one or more embodiments, the upper surface of the test stage is a thermal control surface.

In one or more embodiments, the test stage 102 includes an array of vertical supply holes 116 that open through the upper surface and are fluidly connected to a vacuum source 812 and to a compressed gas source 802.

In one or more embodiments, the apparatus 100 also includes a modulator 822 and a proportional valve 824 that are fluidly connected between the compressed gas source and the vertical supply holes 116.

In one or more embodiments, the test stage 102 also includes an array of slanted supply holes 118 or 119 that are fluidly connected to the compressed gas source 802 and that open through the upper surface around the periphery of the array of vertical supply holes 116.

In one or more embodiments, the apparatus 100 also includes a second modulator 814 or 818 and a second proportional valve 816 or 820 that are fluidly connected between the compressed gas source 802 and the array of slanted supply holes 118 or 119.

In one or more embodiments, the apparatus 100 also includes a pressurized liquid supply 810 that is fluidly connected via a proportional valve 830 to the vertical supply holes 116.

In one or more embodiments, the test stage 102 includes at least two corner guides 114 or 314 that protrude from the upper surface and define vertical surfaces that are perpendicular to the upper surface and to each other.

According to another aspect, an exemplary apparatus 100 includes a test probe 108 that has an array of test cups 110 at an underside of the test probe, each test cup having a downward opening, and that has at least one alignment feature 112, 126, or 128 that protrudes from the underside of the test probe beyond the openings of the test cups and that has an opening larger than the openings of the test cups. The apparatus 100 also includes a test stage 102 that has an upper surface 104 confronting the underside of the test probe and that is movable by a Z drive motor 106 along a Z-axis toward and away from the test probe. The test stage 102 includes an array of vertical supply holes 116 opening through the upper surface and fluidly connected to a vacuum source 812 and to a compressed gas source 802 and includes a plurality of corner guides 114 or 314 that protrude upward from the upper surface. The apparatus 100 also includes a modulator 822 and a proportional valve 824 fluidly connected in series between the compressed gas source 802 and the vertical supply holes 116. The apparatus 100 also includes a coarse align stage 802 that is offset from the test probe and the test stage along a direction parallel to the confronting surfaces of the test probe and the test stage. The apparatus 100 also includes a pick and place tool 900 that has an arm 906, a head 910, and a tool motor 908 that can move the head from a position above the coarse align stage to a position between the test probe and the test stage by moving the arm around a Z axis and moving the head up and down parallel to the Z axis. Additionally, the apparatus 100 includes a controller 840 that is electrically connected to the tool motor 908 and to the Z drive motor 106 for directing movement of the pick and place tool and of the test stage, and that is electrically connected to the modulator 822 and to the proportional valve 824 for controlling flows of compressed gas and vacuum to and from the thermal control surface 104, so as to accomplish a method of: (a) moving a semiconductor die 200 from the coarse align stage 902 onto the upper surface 104 of the test stage 102 with solder balls 202 of the die facing upward; (b) fluidizing motion of the die with reference to the test stage by pulsing gas between the die and the upper surface of the test stage; (c) coarse aligning the die with reference to the test stage by moving the die until adjacent edges of the die contact corner guides 114 or 314 that are disposed on the test stage; (d) raising the test stage toward a test probe until the alignment feature 112, 126, or 128 of the test probe engages a solder ball 204 of the die; and (e) fine aligning the die with reference to the test probe by continuing to raise the test stage until another solder ball 202 of the die fits into one of the test cups 110 of the test probe.

Figure 14:
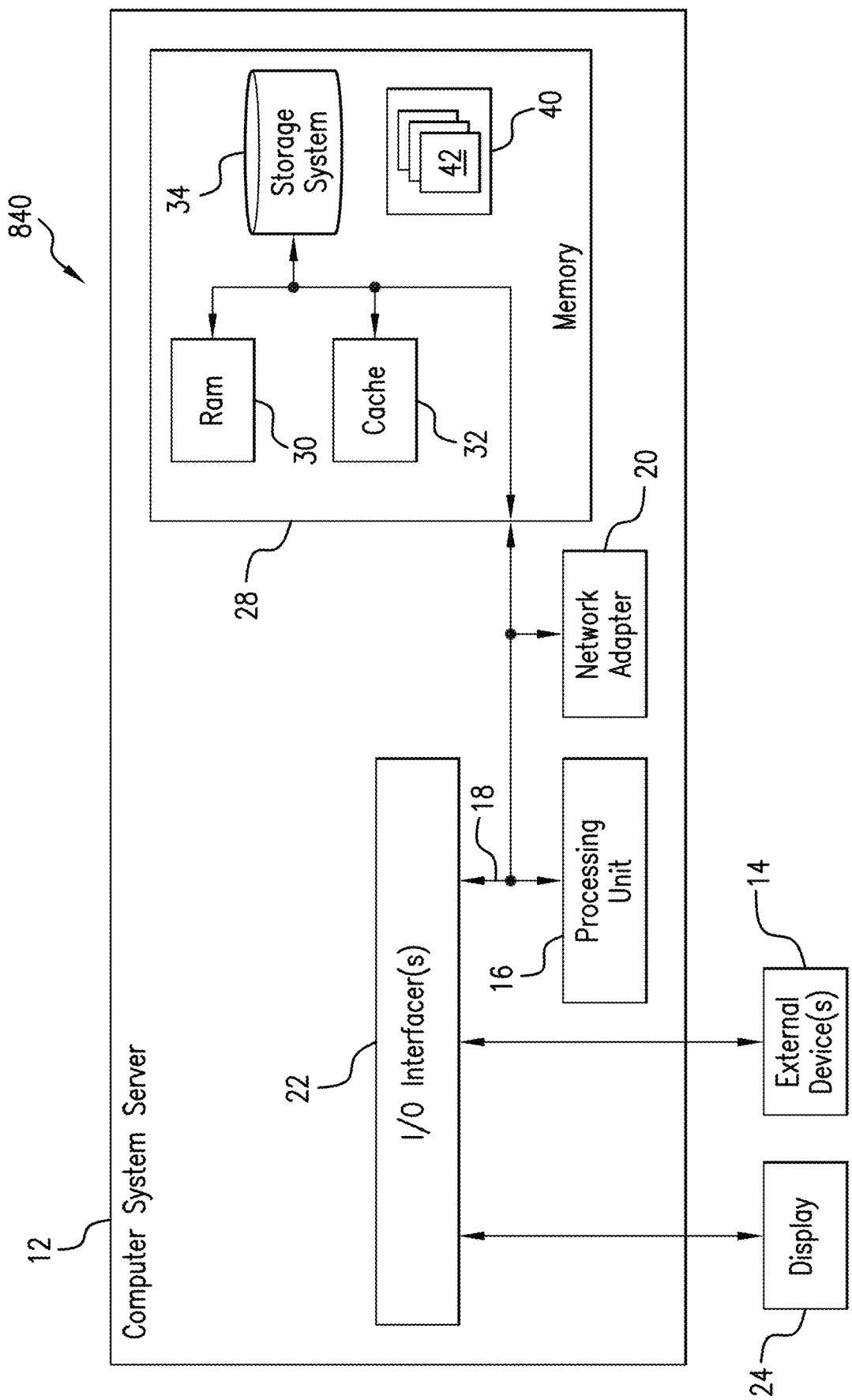
FIG. 14 depicts, in a schematic view, an exemplary process controller for use in controlling the systems of FIGS. 1-9 in order to implement the methods of FIGS. 10-13.

One or more embodiments of the invention, or elements thereof, can be implemented in the form of an apparatus including a memory and at least one processor that is coupled to the memory and operative to perform exemplary method steps, or in the form of a non-transitory computer readable medium embodying computer executable instructions which when executed by a computer cause the computer to perform exemplary method steps. FIG. 14 depicts a process controller 840 that may be useful in implementing one or more aspects and/or elements of the invention (e.g., general-purpose computer, microcontroller, etc.).

In process controller 840 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 14, computer system/server 12 in process controller 840 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. In other instances, non-volatile computer readable media may be connected to bus 18 via a network adapter 20 ("networked drives"). As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as the Z drive motor 106, the tool motor 908, the modulator(s) 814 etc. and the proportional valves 816 etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Thus, one or more embodiments can make use of software running on a general purpose computer or workstation. With reference to FIG. 14, such an implementation might employ, for example, a processor 16, a memory 28, and an input/output interface 22 to a display 24 and external device(s) 14 such as the Z drive motor 106, the tool motor 908, etc. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 14) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the appropriate elements depicted in the block diagrams and/or described herein; by way of example and not limitation, any one, some or all of the modules/blocks and or sub-modules/sub-blocks described. The method steps can then be carried out using the distinct software modules and/or sub-modules of the system, as described above, executing on one or more hardware processors such as 16. Further, a computer program product can include a computer-readable storage medium with code adapted to be implemented to carry out one or more method steps described herein, including the provision of the system with the distinct software modules.

Exemplary System and Article of Manufacture Details

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. For example, the structures of FIGS. 6, 7, and 8 could be used with other probe types than the cups that are shown and described with reference to the exemplary embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A method comprising:
  placing a semiconductor die onto a flat upper surface of a test stage with solder balls of the die facing upward;
  fluidizing motion of the die with reference to the test stage by pulsing gas between the die and the upper surface of the test stage;
  coarse aligning the die with reference to the test stage by moving the die until adjacent edges of the die contact corner guides disposed on the test stage;
  raising the test stage toward a test probe until an alignment feature of the test probe engages a first solder ball of the die; and
  fine aligning the die with reference to the test probe by continuing to raise the test stage until a second solder ball of the die fits into a test cup of the test probe.

2. The method of claim 1 further comprising pulsing gas against edges of the die to further fluidize its motion with reference to the test stage.

3. The method of claim 1 further comprising stopping the pulsed gas and applying vacuum under the die between fine aligning and raising the test stage.

4. The method of claim 3 further comprising releasing the vacuum and restoring pulsed gas under the die after the alignment feature engages the first solder ball.

5. The method of claim 4 further comprising stopping the pulsed gas after the second solder ball fits into the test cup.

6. The method of claim 1 further comprising continuing to raise the test stage and continuing to provide pulsed gas under the die until a plurality of solder balls of the die fit into a plurality of test cups of the test probe.

7. The method of claim 6 further comprising halting motion of the test stage upon detecting adequate electrical contact between the test cups and the solder balls.

8. The method of claim 1 further comprising separating the die from the test probe by applying vacuum under the die and lowering the test stage away from the test probe.

9. The method of claim 8 further comprising loosening stiction between the die and the test probe by pulsing gas under the die.

10. The method of claim 9 further comprising loosening stiction by applying pulsed gas to edges of the die while pulsing gas under the die.

11. The method of claim 1 further comprising separating the die from the test probe by applying pressurized liquid between the die and the test stage and rapidly lowering the test stage away from the test probe.

12. An apparatus comprising:
a test probe that has an array of test cups at an underside of the test probe, each test cup having a downward opening, and that has at least one guide cup that protrudes from the underside of the test probe beyond the openings of the test cups; and
a test stage that has an upper surface confronting the underside of the test probe and that is movable by a Z drive motor along a Z-axis toward and away from the test probe, wherein a plurality of air supply holes penetrate the upper surface of the test stage.

13. The apparatus of claim 12 wherein the apparatus does not include X, Y, or theta drive motors.

14. The apparatus of claim 12 wherein the supply holes are fluidly connected to a vacuum source and to a compressed gas source.

15. The apparatus of claim 14 further comprising a modulator and a proportional valve that are fluidly connected between the compressed gas source and the vertical supply holes.

16. The apparatus of claim 14 wherein the test stage also includes an array of slanted supply holes that are fluidly connected to the compressed gas source and that open through the upper surface around the periphery of the array of vertical supply holes.

17. The apparatus of claim 16 further comprising a second modulator and a second proportional valve that are fluidly connected between the compressed gas source and the array of slanted supply holes.

18. The apparatus of claim 14 further comprising a pressurized liquid supply that is fluidly connected via a proportional valve to the vertical supply holes.

19. The apparatus of claim 12 wherein the test stage includes at least two corner guides that protrude from the upper surface and define vertical surfaces that are perpendicular to the upper surface and to each other.

20. An apparatus comprising:
a test probe that has an array of test cups at an underside of the test probe, each test cup having a downward opening, and that has at least one alignment feature that protrudes from the underside of the test probe beyond the openings of the test cups and that has a downward opening larger than the openings of the test cups;
a test stage that has an upper surface confronting the underside of the test probe and that is movable by a Z drive motor along a Z-axis toward and away from the test probe, wherein the test stage includes an array of vertical supply holes opening through the upper surface and includes a plurality of corner guides that protrude upward from the upper surface;
a modulator and a proportional valve fluidly connected in series with the vertical supply holes;
a coarse align stage that is offset from the test probe and the test stage along a direction parallel to the confronting surfaces of the test probe and the test stage;
a pick and place tool that has an arm, a head, and a tool motor that can move the head from a position above the coarse align stage to a position between the test probe and the test stage by moving the arm around a Z axis and moving the head up and down parallel to the Z axis; and
a process controller that is electrically connected to the tool motor and to the Z drive motor for directing movement of the pick and place tool and of the test stage, and that is electrically connected to the modulator and to the proportional valve for controlling flows of compressed gas and vacuum to and from the thermal control surface, the process controller including a processor and a computer readable storage medium encoded with instructions that configure the processor to:
control the tool motor in order to move a semiconductor die from the coarse align stage onto the upper surface of the test stage with solder balls of the die facing upward;
control the proportional valve and the modulator in order to fluidize motion of the die with reference to the test stage by pulsing gas between the die and the upper surface of the test stage;
control the Z drive motor in order to coarse align the die with reference to the test stage by moving the die until adjacent edges of the die contact the corner guides that are disposed on the test stage;
further control the Z drive motor in order to raise the test stage toward the test probe until the alignment feature of the test probe engages one of the solder balls of the die; and
further control the Z drive motor in order to fine align the die with reference to the test probe by continuing to raise the test stage until another of the solder balls of the die fits into one of the test cups of the test probe.

* * * * *